(12) United States Patent
Matsuura et al.

(10) Patent No.: US 8,283,894 B2
(45) Date of Patent: Oct. 9, 2012

(54) VOLTAGE MEASURING APPARATUS FOR ASSEMBLED BATTERY

(75) Inventors: Kimihiro Matsuura, Makinohara (JP); Satoshi Ishikawa, Makinohara (JP); Masashi Sekizaki, Makinohara (JP); Masahiro Hasegawa, Makinohara (JP)

(73) Assignee: Yazaki Corporation, Tokyo (JP)

( * ) Notice: Subject to any disclaimer, the term of this patent is extended or adjusted under 35 U.S.C. 154(b) by 302 days.

(21) Appl. No.: 12/815,694

(22) Filed: Jun. 15, 2010

(65) Prior Publication Data

US 2010/0321026 A1 Dec. 23, 2010

(30) Foreign Application Priority Data

Jun. 19, 2009 (JP) ................................. 2009-146078

(51) Int. Cl.
*H01M 10/46* (2006.01)
(52) U.S. Cl. ......................................... 320/134; 320/136
(58) Field of Classification Search .................. 320/107, 320/112, 116, 118, 119, 134, 136
See application file for complete search history.

(56) References Cited

U.S. PATENT DOCUMENTS

| 5,977,725 A | * | 11/1999 | Miyazaki et al. | 315/291 |
| 2004/0104701 A1 | * | 6/2004 | Ohshima | 318/445 |

FOREIGN PATENT DOCUMENTS

JP 2006-304365 A 11/2006

* cited by examiner

*Primary Examiner* — Edward Tso
(74) *Attorney, Agent, or Firm* — Sughrue Mion, PLLC (57) ABSTRACT

There is provided a voltage measuring apparatus for measuring a voltage of an assembled battery in which a plurality of unit cells are connected in series. The voltage measuring apparatus comprises: block voltage detection sections, each section measuring a voltage of each block of a plurality of blocks into which the plurality of unit cells are divided; a reference voltage output section provided in each of the voltage detection sections to output a reference voltage; a difference voltage calculating section which calculates a difference voltage between measured values of the reference voltages measured by two block voltage detection sections; a difference voltage determination section which determines whether each of the difference voltages exceeds a given threshold voltage or not; and an abnormality determination section which determines that abnormality occurs in the voltage measuring apparatus when at least one of the difference voltages is determined as greater than the threshold voltage.

10 Claims, 5 Drawing Sheets

VOLTAGE MEASURING APPARATUS FOR ASSEMBLED BATTERY

BACKGROUND OF THE INVENTION

1. Field of the Invention

The present invention relates to a voltage measuring apparatus for detecting output voltages of an assembled battery in which a plurality of unit cells are connected in series so as to generate a desired voltage.

2. Background art

For example, a hybrid vehicle has a high voltage battery serving as a driving power source for the motor. In the high voltage battery, for example, a plurality of unit cells for secondary battery (storage battery) such as nickel-hydrogen battery cells and lithium battery cells are connected in series so as to provide a high voltage.

Further, in order that the secondary battery should be prevented from being overcharged or overdischarged, the charging state of each unit cell need to be checked. Thus, in the background art, a plurality (e.g., 55) of unit cells are divided into, for example, five blocks (i.e., each 11 unit cells correspond to one block). Then, the voltage of each block is measured in real time by a voltage measuring IC provided in each block.

In this case, each voltage measuring IC measures the voltages of the unit cells (e.g., 11 unit cells) in the block. Further, an A/D converter owned by the voltage measuring IC converts the detected analog voltage signals into digital signals, and then transmits the signals to a main microcomputer. Then, when voltage abnormality occurs in a block, the main microcomputer generates an alarm so as to notify the voltage abnormality to a crew of the vehicle, or alternatively performs compensation processing for the voltage.

Nevertheless, when fault occurs in at least one of the plurality of voltage measuring ICs, the voltages of the unit cells are not measured accurately. In particular, when fault occurs in the A/D converter provided in each voltage measuring IC, or alternatively when the output voltage of a standard voltage supply used for A/D conversion fluctuates, the measured cell voltages are not converted into accurate digital signals. This causes a problem that the accuracy of measurement of the cell voltages is degraded.

Thus, in the background art, a fault detection device has been proposed for detecting fault occurrence in an A/D converter (see, for example, JP-A-2006-304365). In JP-A-2006-304365, by using an A/D converter, two reference voltages each having a known value are converted into digital signals. Then, when the difference between these voltages increases, it is determined that fault has occurred in the A/D converter.

Nevertheless, in the invention described in JP-A-2006-304365, two reference voltages are converted into digital signals by the same A/D converter. Then, fault occurrence is detected on the basis of the difference between these voltages. This approach causes a disadvantage that in a case that no change arises in the difference value even when fault occurs in the A/D converter, the fault occurrence is not detected.

SUMMARY OF THE INVENTION

The present invention has been devised in order to resolve such a problem in the background art. An object of the present invention is to provide a voltage measuring apparatus for an assembled battery in which when fault occurs in a voltage measuring IC (block voltage detecting section), the fault occurrence is detected reliably.

In order to achieve the object, there is provided a voltage measuring apparatus for measuring an output voltage of an assembled battery in which a plurality of unit cells are connected in series, the voltage measuring apparatus comprising: block voltage detection sections, each section measuring a voltage of each block of a plurality of blocks into which the plurality of unit cells are divided; a reference voltage output section provided in each of the voltage detection sections to output a reference voltage; a difference voltage calculating section which is adapted to calculate a difference voltage between a measured value of the reference voltage measured by one of the block voltage detection sections and a measured value of the reference voltage measured by another of the block voltage detection sections; a difference voltage determination section which is adapted to determine whether each of the difference voltages exceeds a given threshold voltage or not; and an abnormality determination section which is adapted to determine that abnormality occurs in the voltage measuring apparatus when at least one of the difference voltages is determined as greater than the threshold voltage.

There is also provided a voltage measuring apparatus for measuring an output voltage of an assembled battery in which a plurality of unit cells are connected in series, the voltage measuring apparatus comprising: block voltage detection sections, each section measuring a voltage of each block of a plurality of blocks into which the plurality of unit cells are divided; a reference voltage output section provided in each of the voltage detection sections to output a reference voltage; a difference voltage calculating section which is adapted to calculate a difference voltage between a measured value of the reference voltage measured by one of the block voltage detection sections and a measured value of the reference voltage measured by another of the block voltage detection sections; a standard difference voltage storing section for storing therein a standard difference voltage as a standard of the difference voltage between a measured value of the reference voltage measured by the one of the block voltage detection sections and a measured value of the reference voltage measured by the another of the block voltage detection sections; a difference voltage determination section which is adapted to determine whether a difference between the difference voltage calculated by the difference voltage calculating section and the standard difference voltage stored in the standard difference voltage storing section exceeds a given threshold voltage or not; and an abnormality determination section which is adapted to determine that abnormality occurs in the voltage measuring apparatus when the difference is determined as greater than the threshold voltage.

According to the above-mentioned configurations, it is possible to provide a voltage measuring apparatus in which, when fault occurs in a voltage measuring IC (block voltage detecting section), the fault occurrence is detected reliably.

DETAILED DESCRIPTION OF THE EXEMPLARY EMBODIMENTS

There is provided a voltage measuring apparatus for measuring an output voltage of an assembled battery in which a plurality of unit cells are connected in series, the voltage measuring apparatus comprising: block voltage detection sections, each section measuring a voltage of each block of a plurality of blocks into which the plurality of unit cells are divided; a reference voltage output section provided in each of the voltage detection sections to output a reference voltage; a difference voltage calculating section which is adapted to calculate a difference voltage between a measured value of the reference voltage measured by one of the block voltage detection sections and a measured value of the reference voltage measured by another of the block voltage detection sections; a difference voltage determination section which is adapted to determine whether each of the difference voltages exceeds a given threshold voltage or not; and an abnormality determination section which is adapted to determine that abnormality occurs in the voltage measuring apparatus when at least one of the difference voltages is determined as greater than the threshold voltage.

According to the configuration, the reference voltage is measured by the block voltage detection section of each block. Then, the difference voltage is calculated for each two measured reference voltage values. Then, when the difference voltage is greater than the threshold voltage, it is determined that abnormality has occurred in the voltage measuring apparatus. Here, the reference voltages to be measured by respective block voltage detection sections are set to be approximately the same voltage value. Thus, when abnormality has not occurred in the apparatus, the measured reference voltage values detected by the individual block voltage detection section have approximately the same value, and hence each difference voltage should be approximately zero. Thus, when the difference voltage becomes greater than the threshold voltage, this indicates that any abnormality has occurred. Accordingly, when a significant non-zero voltage difference is detected, the occurrence of abnormality in the voltage measuring apparatus is immediately recognized and then notified to the user.

There is also provided a voltage measuring apparatus for measuring an output voltage of an assembled battery in which a plurality of unit cells are connected in series, the voltage measuring apparatus comprising: block voltage detection sections, each section measuring a voltage of each block of a plurality of blocks into which the plurality of unit cells are divided; a reference voltage output section provided in each of the voltage detection sections to output a reference voltage; a difference voltage calculating section which is adapted to calculate a difference voltage between a measured value of the reference voltage measured by one of the block voltage detection sections and a measured value of the reference voltage measured by another of the block voltage detection sections; a standard difference voltage storing section for storing therein a standard difference voltage as a standard of the difference voltage between a measured value of the reference voltage measured by the one of the block voltage detection sections and a measured value of the reference voltage measured by the another of the block voltage detection sections; a difference voltage determination section which is adapted to determine whether a difference between the difference voltage calculated by the difference voltage calculating section and the standard difference voltage stored in the standard difference voltage storing section exceeds a given threshold voltage or not; and an abnormality determination section which is adapted to determine that abnormality occurs in the voltage measuring apparatus when the difference is determined as greater than the threshold voltage.

According to the configuration, the difference of the measured reference voltage values detected by each two pieces of block voltage detection sections is stored in advance as a standard difference voltage into the standard voltage storage section. Then, at the time of abnormality diagnosis, the difference voltage of measured reference voltage values detected by each two pieces of block voltage detecting sections is compared with the above-mentioned standard difference voltage. Then, the difference between a difference voltage and the standard difference voltage set up in advance becomes greater than a threshold voltage, it is determined that abnormality has occurred in the voltage measuring apparatus. Here, the reference voltages each to be measured by each block voltage detecting section are set to be approximately the same voltage value. Then, when abnormality has not occurred in the device, the difference of the measured reference voltage values detected by each two pieces of block voltage detecting sections should have an approximately constant value. Thus, when the difference between the difference of measured reference voltage values and the standard difference voltage becomes greater than a threshold voltage, this indicates that any abnormality has occurred. Accordingly, when a significant non-zero difference is detected, the occurrence of abnormality in the voltage measuring apparatus is immediately recognized and then notified to the user.

The voltage measuring apparatus may be configured in that the block voltage detection section includes an A/D converter that digitizes a voltage of each of the unit cells and the reference voltages, and the difference voltage calculating section calculates the difference voltage between measured values of the two digitized reference voltages.

According to the configuration, the A/D converter is provided in each block voltage detection section. Then, the A/D converter digitizes the reference voltage signal so that a measured reference voltage value is obtained. The difference voltage calculating section calculates a difference voltage of two digitized measured reference voltage values. Thus, data communication is performed in the form of digital signals. Further, when abnormality occurs in the A/D converter or in the standard voltage supply for supplying the reference voltage to the A/D converter, the occurrence of abnormality is detected reliably.

The voltage measuring apparatus may be configured in that the plurality of unit cells are divided into k blocks, and the difference voltage calculating section calculates the difference voltage between the reference voltage measured by the block voltage detection section corresponding to the n-th block ($1 \leq n < k$) among the k blocks and the reference voltage measured by the block voltage detection section corresponding to the (n+1)-th block.

According to the configuration, among the k pieces of block voltage detection sections, the difference of the measured reference voltage values acquired by the n-th and the (n+1)-th block voltage detection sections is calculated. Thus, when abnormality occurs in any one of the two pieces of block voltage detection sections, the occurrence of abnormality is detected reliably.

The voltage measuring apparatus may be configured in that the difference voltage calculating section calculates the difference voltage between the reference voltage measured by the block voltage detection section corresponding to the k-th block and the reference voltage measured by the block voltage detection section corresponding to the 1st block.

According to the configuration, the difference of the measured reference voltage values acquired by the first block voltage detection section and the k-th block voltage detection section is calculated. Thus, when abnormality occurs in the first or the k-th block voltage detection section, the occurrence of abnormality is detected reliably.

The voltage measuring apparatus may be configured in that the difference voltage calculating section calculates the difference voltage between the reference voltages measured by the mutually-adjacent block voltage detection sections.

According to the configuration, among the plural pieces of block voltage detection sections, the difference of the measured reference voltage values acquired by each mutually adjacent two pieces of block voltage detection section is calculated. Then, since mutually adjacent pieces of block voltage detection sections are installed closely to each other and hence the ambient temperature is expected approximately common, the occurrence of abnormality in a block voltage detection section is detected accurately without the influence of the ambient temperature.

Embodiments of the present invention are described below with reference to the drawings.

[First Embodiment]

Figure 1:
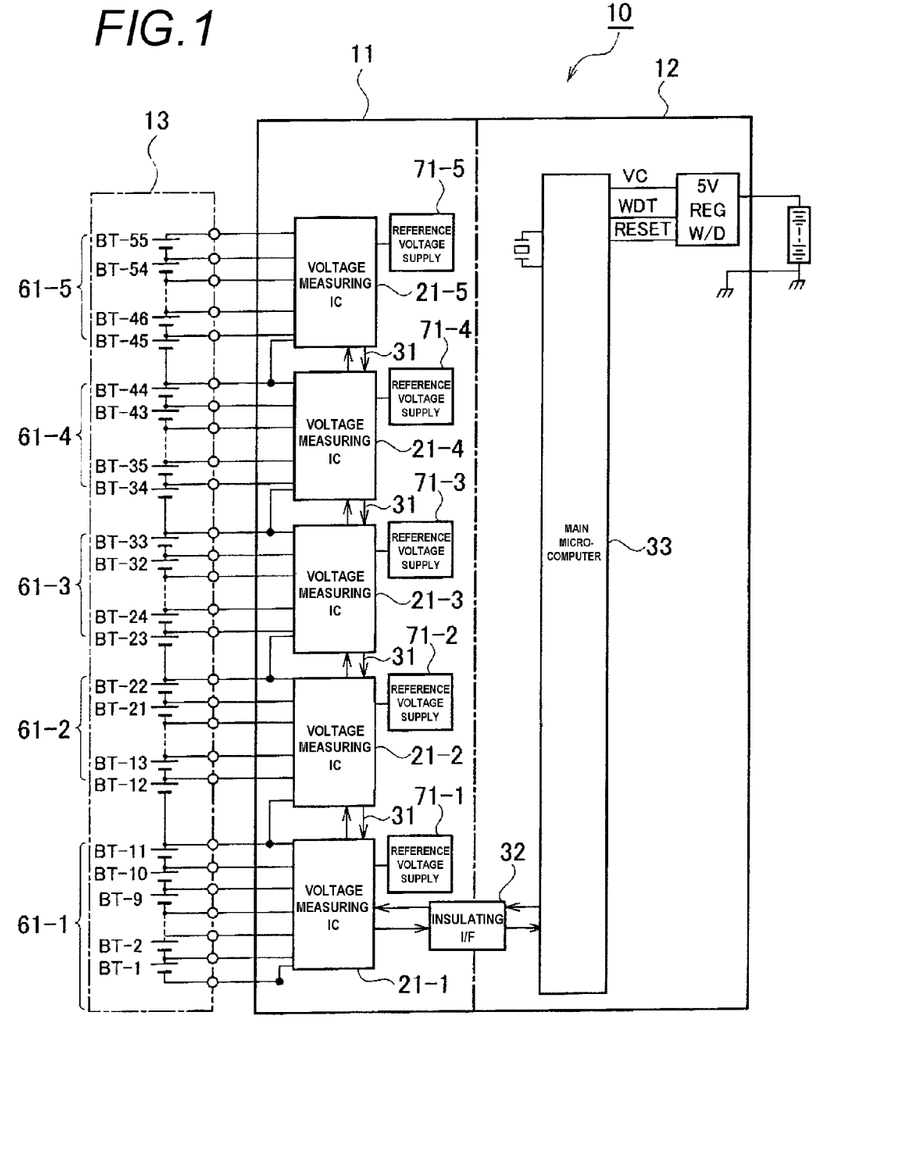
FIG. 1 is a circuit diagram showing a voltage measuring apparatus according to embodiments of the present invention, together with a secondary battery.

FIG. 1 is a block diagram showing: a voltage measuring apparatus 10 according to embodiments of the present invention; and a secondary battery 13 (an assembled battery) including a plurality of unit cells BT1 to BT55. The secondary battery 13 employed in the present embodiment is used, for example, as a high voltage battery for driving a motor in a hybrid vehicle or an electric vehicle.

As shown in FIG. 1, the voltage measuring apparatus 10 according to the present embodiment is divided into a high-voltage side device 11 and a low-voltage side device 12 with an insulating interface 32 in between.

The high-voltage side device 11 includes five voltage measuring ICs (block voltage detecting sections), that is, a first voltage measuring IC (21-1) to a fifth voltage measuring IC (21-5). Then, the first voltage measuring IC (21-1) measures the output voltages of the 11 unit cells BT1 to BT11 grouped as a first block 61-1. Further, the second voltage measuring IC (21-2) measures the output voltages of the 11 unit cells BT12 to BT22 grouped as a second block 61-2. Similarly, the third voltage measuring IC (21-3) measures the output voltages of the 11 unit cells BT23 to BT33 grouped as a third block 61-3, the fourth voltage measuring IC (21-4) measures the output voltages of the 11 unit cells BT34 to BT44 grouped as a fourth block 61-4, and the fifth voltage measuring IC (21-5) measures the output voltages of the 11 unit cells BT45 to BT55 grouped as a fifth block 61-5.

Further, each of the voltage measuring ICs (21-1 to 21-5) has an A/D converter 26 (see FIG. 2), and by using a standard voltage outputted from each of the standard voltage supplies 71-1 to 71-5 for A/D conversion, converts a voltage signal inputted from each unit cell provided in each block (the first block to the fifth block) into a digital voltage signal.

Further, the second to the fifth voltage measuring ICs (21-2 to 21-5) are connected through communication lines 31 to the first voltage measuring IC (21-1). Then, the first voltage measuring IC (21-1) is connected through the insulating interface 32 to the main microcomputer 33 provided on the low-voltage side device 12. That is, the main microcomputer 33 and the voltage measuring ICs (21-1 to 21-5) are connected to each other by daisy chain communication through the insulating interface 32.

As described later, the main microcomputer 33 calculates difference voltages $\Delta V$ between reference voltages Vref measured by the voltage measuring ICs (21-1 to 21-5), and then determines whether each difference voltage $\Delta V$ is greater than a threshold voltage Vth1 set up in advance. Then, when any difference voltage $\Delta V$ is greater than the threshold voltage Vth1, the main microcomputer 33 determines that abnormality has occurred in the corresponding voltage measuring IC.

That is, the main microcomputer 33 has the function of difference voltage calculating section for measuring the reference voltage through each block voltage detecting section (voltage measuring IC) and then calculating a difference voltage between the measured reference voltage value acquired by one block voltage detecting section and the measured reference voltage value acquired by another block voltage detecting section. Further, the main microcomputer 33 has also the function of difference voltage determining section for determining whether each difference voltage is greater than the threshold voltage Vth1 set up in advance. The main microcomputer 33 further has the function of abnormality determining section for, when at least one difference voltage is determined as greater than the threshold voltage Vth1, determining that abnormality has occurred in the voltage measuring apparatus.

Figure 2:
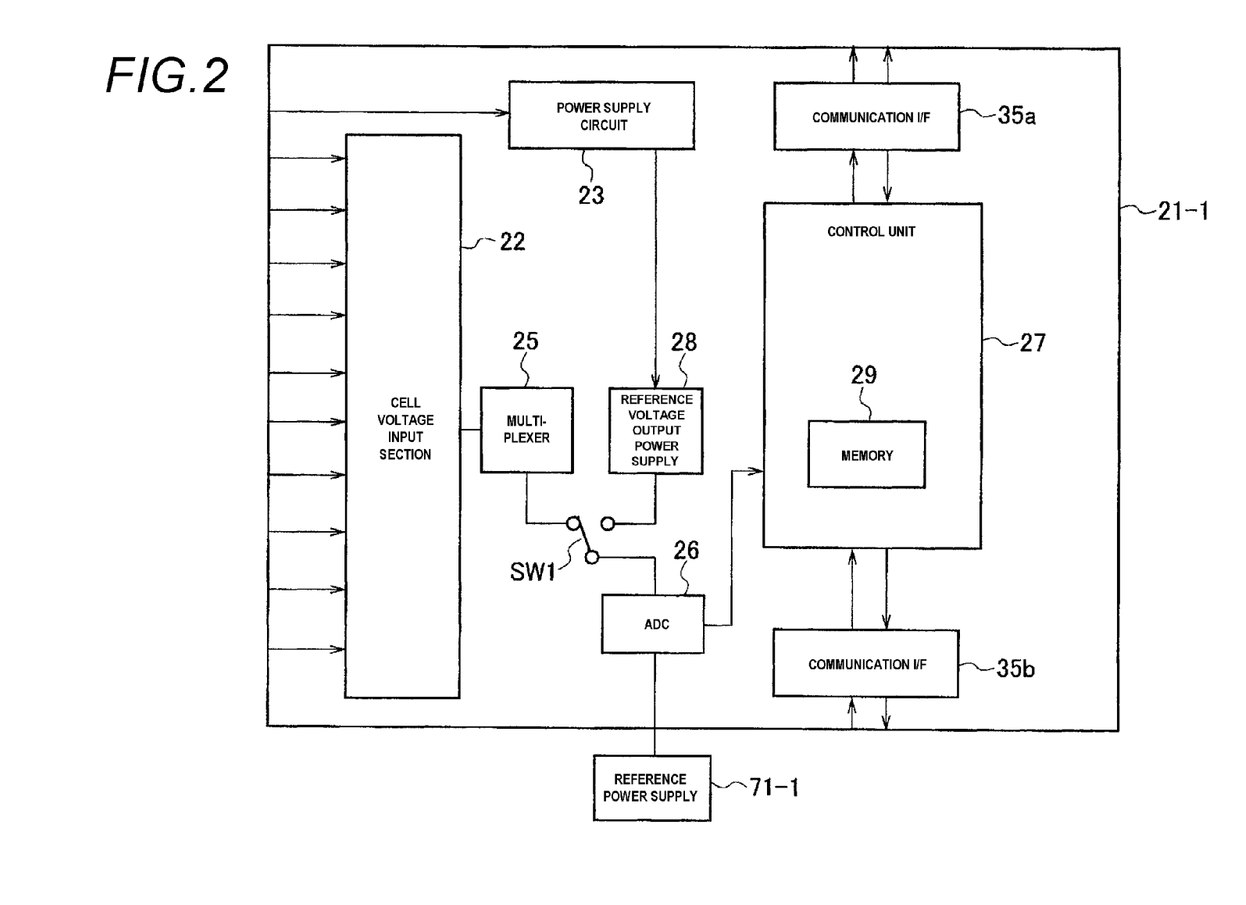
FIG. 2 is a block diagram showing a detailed configuration of a voltage measuring apparatus according to the embodiments of the present invention.

FIG. 2 is a block diagram showing the internal configuration of the first voltage measuring IC (21-1). Then, the detailed configuration of the first voltage measuring IC (21-1) is described below with reference to FIG. 2. Here, the second to the fifth voltage measuring ICs (21-2 to 21-5) have the same configuration as the first voltage measuring IC (21-1). Thus, their detailed description is omitted.

As shown in FIG. 2, the first voltage measuring IC (21-1) includes: a power supply circuit 23 for receiving electric power outputted from the unit cells and then generating a voltage to be used in the first voltage measuring IC (21-1); a reference voltage output power supply (reference voltage output section) 28 for generating and outputting a reference voltage on the basis of the voltage outputted from the power supply circuit 23; and a cell voltage input section 22 connected to the unit cells BT1 to BT11 of the block 61-1 and detecting their output voltages.

The first voltage measuring IC (21-1) further includes: a multiplexer 25 for converting into a serial signal the voltage signals of the individual unit cells outputted through the cell voltage input section 22, and then outputting the serial signal; an A/D converter 26 for selectively receiving the voltage signal outputted from the multiplexer 25 or the reference voltage outputted from the reference voltage output power supply 28, and then converting the received signal into a digital signal; and a selection switch SW1 for performing switching between the voltage signal outputted from the multiplexer 25 and the reference voltage outputted from the reference voltage output power supply 28, so as to output the selected signal to the A/D converter 26.

On the basis of the standard voltage outputted from the standard voltage supply 71-1, the A/D converter 26 converts the analog signal into a digital signal.

The first voltage measuring IC (21-1) further includes a control unit 27 and two communication I/Fs 35a and 35b.

The control unit 27 has a memory 29 for data storage, and performs comprehensive control including switching control for the selection switch SW1. In particular, when a command signal for reference voltage measurement is transmitted from the main microcomputer 33 (see FIG. 1), the control unit 27 switches the selection switch SW1 to the reference voltage output power supply 28 side so that the reference voltage Vref is outputted to the A/D converter 26. Further, the control unit 27 stores into the memory 29 the voltage signal digitized by the A/D converter 26, and transmits the signal through the communication I/Fs 35$a$ and 35$b$ to the main microcomputer 33 shown in FIG. 1.

Next, a procedure of self-diagnosis processing executed by the voltage measuring apparatus 10 according to the present embodiment is described below with reference to a flow chart shown in FIG. 3.

At the time of normal operation such as an operation that electric power outputted from the secondary battery 13 is supplied to the motor so that the motor is driven, the control unit 27 connects the selection switch SW1 to the multiplexer 25 side. Thus, the voltage signal detected by each unit cell is digitized by the A/D converter 26, and then transmitted through the communication I/Fs 35$a$ and 35$b$ to the main microcomputer 33. As a result, the main microcomputer 33 recognizes the output voltage of each unit cell. Accordingly, when abnormality occurs in an output voltage, that is, when an output voltage rises abnormally or falls abnormally, the abnormality is detected and notified to the user through an alarm or the like.

Figure 3:
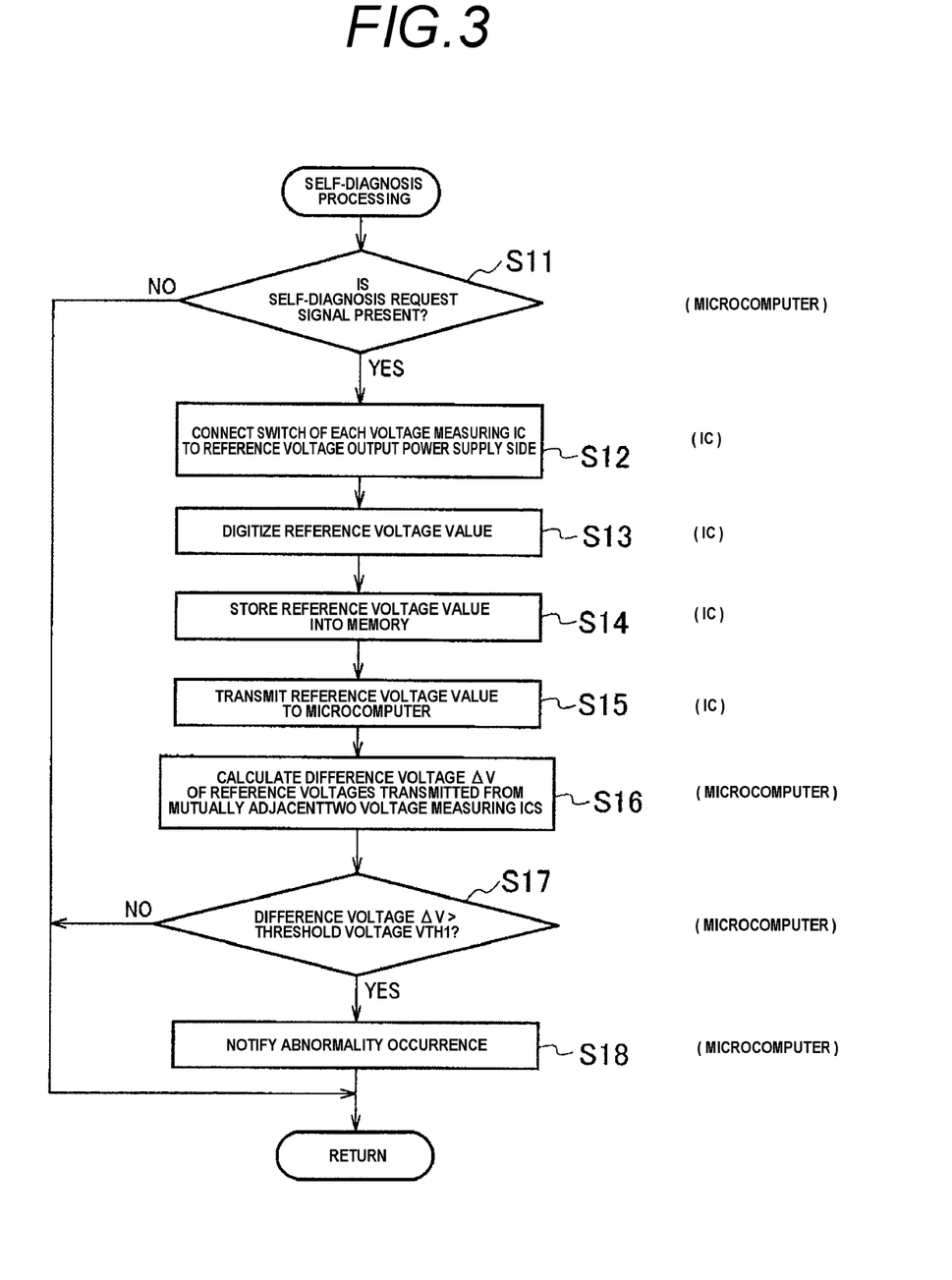
FIG. 3 is a flow chart showing a procedure of self-diagnosis processing performed by a voltage measuring apparatus according to a first embodiment of the present invention.

Further, at a predetermined timing when ignition of the vehicle is turned ON, etc., the main microcomputer 33 outputs a self-diagnosis request signal (step S11 in FIG. 3). The self-diagnosis request signal is transmitted through the communication line 31 the voltage measuring ICs (21-1 to 21-5).

When the self-diagnosis request signal is received (YES at step S11), each of the voltage measuring ICs (21-1 to 21-5) connects the selection switch SW1 shown in FIG. 2 to the reference voltage output power supply 28 side (step S12). As a result, the reference voltage Vref outputted from the reference voltage output power supply 28 is outputted to the A/D converter 26.

Then, the A/D converter 26 of each of the voltage measuring ICs (21-1 to 21-5) digitizes the reference voltage signal Vref (step S13). This digital signal is then stored into the memory 29 (step S14). Further, the digitized reference voltage value Vref is transmitted to the main microcomputer 33 through the communication I/Fs 35$a$ and 35$b$ and the communication line 31 (step S15). As a result, the main microcomputer 33 receives the reference voltage values Vref-1 to Vref-5 transmitted from the voltage measuring ICs (21-1 to 21-5).

The main microcomputer 33 calculates a difference voltage $\Delta V$ of the reference voltages Vref of each mutually adjacent two voltage measuring ICs (step S16). Specifically, a difference voltage $\Delta V$-1 is calculated between Vref-1 and Vref-2, a difference voltage $\Delta V$-2 is calculated between Vref-2 and Vref-3, a difference voltage $\Delta V$-3 is calculated between Vref-3 and Vref-4, a difference voltage $\Delta V$-4 is calculated between Vref-4 and Vref-5, and a difference voltage $\Delta V$-5 is calculated between Vref-5 and Vref-1.

Then, the main microcomputer 33 compares each of the difference voltage values $\Delta V$-1 to $\Delta V$-5 obtained in the above-mentioned arithmetic operation, with the threshold voltage Vth1 set up in advance (step S17). Then, when it is determined that at least one of the five difference voltages $\Delta V$-1 to $\Delta V$-5 exceeds the threshold voltage Vth1 (YES at step S17), the occurrence of abnormality is notified by alarm tone or through an alarm lamp (not shown) (step S18).

That is, the reference voltages Vref-1 to Vref-5 having approximately the same value are digitized respectively by the A/D converters 26 of the voltage measuring ICs (21-1 to 21-5). Then, a difference voltage $\Delta V$ is calculated between the reference voltages Vref digitized by the A/D converters 26 of each mutually adjacent two voltage measuring ICs. Then, in a normal condition, each difference voltage $\Delta V$ is expected to be approximately zero. Thus, a situation that any difference voltage $\Delta V$ is greater than the threshold value Vth1 indicates that abnormality occurs in at least one of the two voltage measuring ICs. Thus, in this case, an alarm is generated so that the occurrence of abnormality is notified to the user.

As such, in the voltage measuring apparatus 10 according to the first embodiment, a difference voltage $\Delta V$ is calculated from reference voltages Vref measured by each two voltage measuring ICs. Then, when the difference voltage $\Delta V$ is greater than the threshold value Vth1, the occurrence of abnormality is detected. Thus, when abnormality occurs in any one of the plurality of voltage measuring ICs (21-1 to 21-5), the occurrence of abnormality is detected accurately and then immediately notified to the user.

Further, the difference voltage $\Delta V$ is calculated for mutually adjacent voltage measuring ICs. Thus, since the ambient temperature is expected to be approximately the same for mutually adjacent blocks, the influence of an error caused by a change in the ambient temperature is expected to be reduced.

[Second Embodiment]

Next, a voltage measuring apparatus according to a second embodiment of the present invention is described below. The voltage measuring apparatus according to the second embodiment has the same configuration as that of the first embodiment described above with reference to FIG. 1, but has a procedure of self-diagnosis processing different from that of the first embodiment. Detailed description is given below.

In the second embodiment, the reference voltages Vref-1 to Vref-5 of the voltage measuring ICs (21-1 to 21-5) are digitized by the A/D converter 26. Then, a difference voltage is calculated from the reference voltages Vref obtained by each mutually adjacent two voltage measuring ICs, and then the calculated difference voltage is stored as a standard difference voltage $\Delta V x$ into a memory (not shown) provided in the main microcomputer 33. In this configuration, at the time of execution of self-diagnosis, the difference voltage $\Delta V$ of the reference voltages Vref measured by each mutually adjacent two voltage measuring ICs is compared with the standard difference voltage $\Delta V x$. Then, when the difference is significant, the occurrence of abnormality is notified.

First, standard difference voltage storage processing according to the second embodiment is described below with reference to a flow chart shown in FIG. 4. This processing is performed as initial setting in a condition that the voltage measuring ICs (21-1 to 21-5) operate normally.

First, the control unit 27 of each of the voltage measuring ICs (21-1 to 21-5) connects the selection switch SW1 to the reference voltage output power supply 28 side (step S31).

Then, the control unit 27 causes the A/D converter 26 to digitize the reference voltage signal Vref outputted from the reference voltage output power supply 28 (step S32), and then stores the digitized reference voltage value Vref into the memory 29 (step S33). The digitized reference voltage value Vref is transmitted through the communication I/Fs 35$a$ and 35$b$ for to the main microcomputer 33 (step S34). As a result, the main microcomputer 33 receives the reference voltage values Vref-1 to Vref-5 transmitted from the voltage measuring ICs (21-1 to 21-5).

The main microcomputer 33 calculates a difference voltage of the reference voltages Vref of each mutually adjacent two voltage measuring ICs (step S35), and then stores the difference voltage value as a standard difference voltage $\Delta Vx$ into a memory (not shown) (step S36). Specifically, the difference voltage between Vref-1 and Vref-2 is referred to as a standard difference voltage $\Delta Vx$-1, the difference voltage between Vref-2 and Vref-3 is referred to as a standard difference voltage $\Delta Vx$-2, the difference voltage between Vref-3 and Vref-4 is referred to as a standard difference voltage $\Delta Vx$-3, the difference voltage between Vref-4 and Vref-5 is referred to as a standard difference voltage $\Delta Vx$-4, and the difference voltage between Vref-5 and Vref-1 is referred to as a standard difference voltage $\Delta Vx$-5. That is, the main microcomputer 33 has the function of standard difference voltage storage section for storing the standard difference voltage serving as the standard for the difference voltage between the measured reference voltage value acquired by one block voltage detecting section (voltage measuring IC) and the measured reference voltage value acquired by another block voltage detecting section.

As a result of the above-mentioned processing, the main microcomputer 33 has, in its memory, the standard difference voltages $\Delta Vx$ ($\Delta Vx$-1 to $\Delta Vx$-5) serving as the standard values for the difference voltages between the reference voltages Vref measured by mutually adjacent two voltage measuring ICs.

Figure 5:
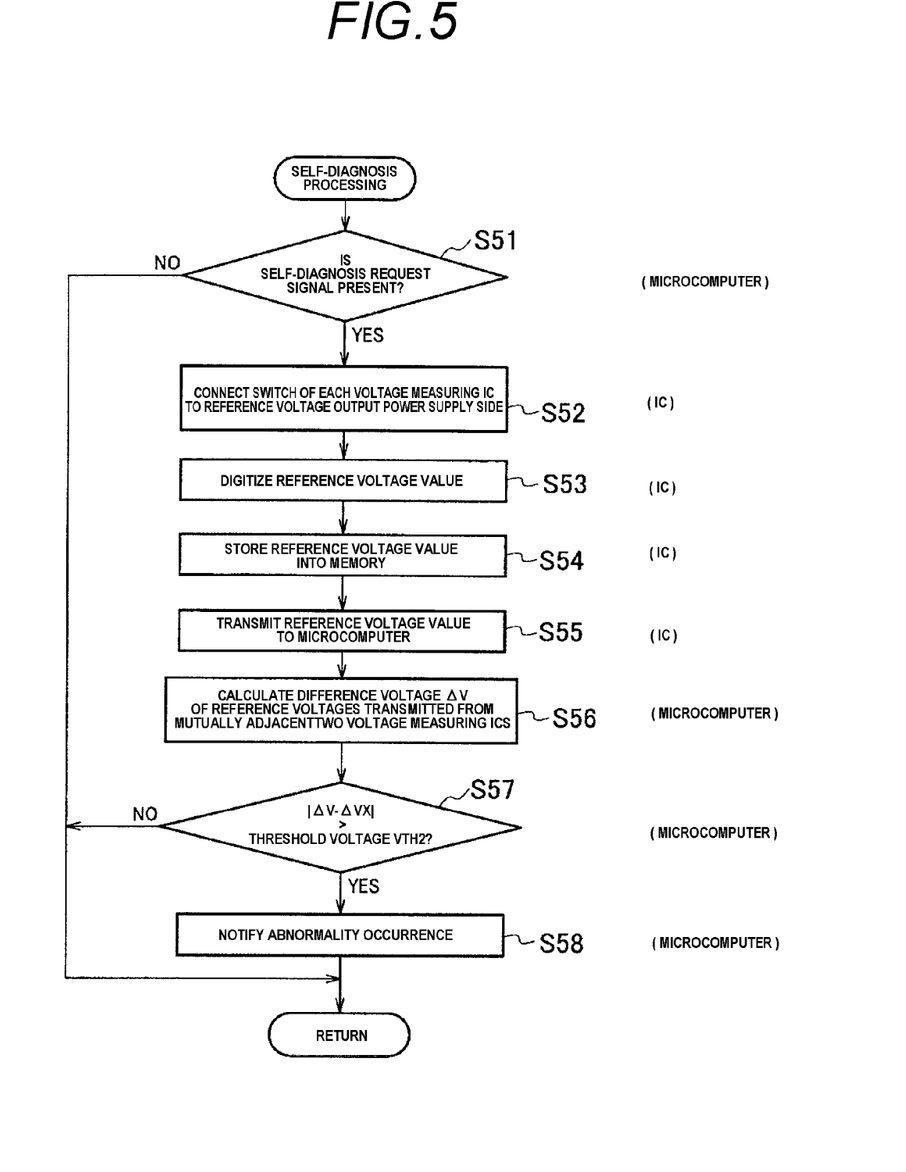
FIG. 5 is a flow chart showing a procedure of self-diagnosis processing performed by a voltage measuring apparatus according to the second embodiment of the present invention.

Next, the procedure of self-diagnosis processing executed by the voltage measuring apparatus 10 according to the second embodiment is described below with reference to a flow chart shown in FIG. 5.

Further, at a predetermined timing when ignition of the vehicle is turned ON, etc., the main microcomputer 33 outputs a self-diagnosis request signal (step S51). The self-diagnosis request signal is transmitted through the communication line 31 to the voltage measuring ICs (21-1 to 21-5).

When the self-diagnosis request signal is received (YES at step S51), each of the voltage measuring ICs (21-1 to 21-5) connects the selection switch SW1 shown in FIG. 2 to the reference voltage output power supply 28 side (step S52). As a result, the reference voltage Vref outputted from the reference voltage output power supply 28 is outputted to the A/D converter 26.

Then, the A/D converter 26 of each of the voltage measuring ICs (21-1 to 21-5) digitizes the reference voltage signal Vref (step S53). This digital signal is then stored into the memory 29 (step S54). Further, the digitized reference voltage value Vref is transmitted to the main microcomputer 33 through the communication I/Fs 35a and 35b and the communication line 31 (step S55). As a result, the main microcomputer 33 receives the reference voltage values Vref-1 to Vref-5 transmitted from the voltage measuring ICs (21-1 to 21-5).

The main microcomputer 33 calculates a difference voltage $\Delta V$ of the reference voltages Vref of each mutually adjacent two voltage measuring ICs (step S56). Specifically, a difference voltage $\Delta V$-1 is calculated between Vref-1 and Vref-2, a difference voltage $\Delta V$-2 is calculated between Vref-2 and Vref-3, a difference voltage $\Delta V$-3 is calculated between Vref-3 and Vref-4, a difference voltage $\Delta V$-4 is calculated between Vref-4 and Vref-5, and a difference voltage $\Delta V$-5 is calculated between Vref-5 and Vref-1.

Figure 4:
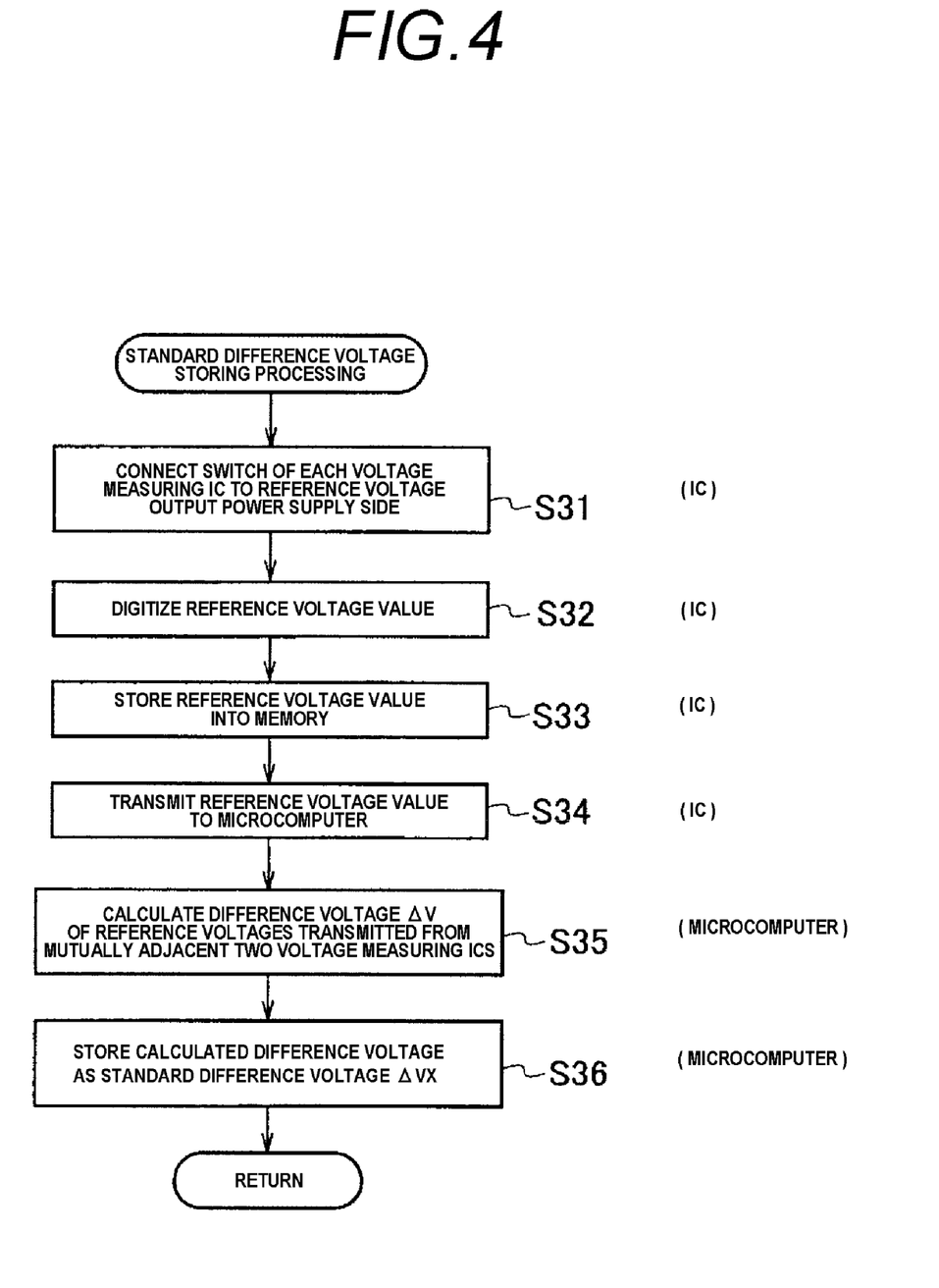
FIG. 4 is a flow chart showing a procedure of standard difference voltage recording processing performed by a voltage measuring apparatus according to a second embodiment of the present invention.

Then, on the basis of the difference voltage values $\Delta V$-1 to $\Delta V$-5 obtained in the above-mentioned arithmetic operation and the standard difference voltage values $\Delta Vx$-1 to $\Delta Vx$-5 stored in the main microcomputer 33 as a result of the processing shown in FIG. 4, the main microcomputer 33 calculates the absolute values of the differences of these values. That is, $|\Delta V\text{-}1\text{-}\Delta Vx\text{-}1|$, $|\Delta V\text{-}2\text{-}\Delta Vx\text{-}2|$, $|\Delta V\text{-}3\text{-}\Delta Vx\text{-}3|$, $|\Delta V\text{-}4\text{-}\Delta Vx\text{-}4|$, and $|\Delta V\text{-}5\text{-}\Delta Vx\text{-}5|$ are calculated. Then, the calculated absolute values are compared with the threshold voltage Vth2 set up in advance (step S57).

Then, when it is determined that at least one of the obtained five absolute values exceeds the threshold voltage Vth2 (YES at step S57), the occurrence of abnormality is notified by alarm tone or through an alarm lamp (not shown) (step S58).

That is, the reference voltages Vref-1 to Vref-5 having approximately the same value are digitized respectively by the A/D converters 26 of the voltage measuring ICs (21-1 to 21-5). Then, a difference voltage $\Delta V$ is calculated between the reference voltages Vref digitized by the A/D converters 26 of each mutually adjacent two voltage measuring ICs. Then, in a normal condition, the difference voltage $\Delta V$ is approximately equal to the standard difference voltage $\Delta Vx$ measured in advance. Thus, a situation that any of the absolute values is greater than the threshold value Vth2 indicates that abnormality occurs in at least one of the mutually adjacent two voltage measuring ICs. Thus, in this case, an alarm is generated so that the occurrence of abnormality is notified to the user.

As such, in the voltage measuring apparatus 10 according to the second embodiment, a difference voltage $\Delta V$ is calculated from the reference voltages Vref measured by two voltage measuring ICs. Then, when the difference between the difference voltage $\Delta V$ and the standard difference voltage $\Delta Vx$ measured in advance is greater than the predetermined threshold value Vth2, the occurrence of abnormality is detected. Thus, when abnormality occurs in any one of the plurality of voltage measuring ICs (21-1 to 21-5), the occurrence of abnormality is detected accurately and then immediately notified to the user.

Further, the difference voltage $\Delta V$ and the standard difference voltage $\Delta Vx$ are calculated for mutually adjacent voltage measuring ICs. Thus, since the ambient temperature is expected to be approximately the same for mutually adjacent blocks, the influence of an error caused by a change in the ambient temperature is expected to be reduced.

The voltage measuring apparatus for the assembled battery according to the present invention has been described above with reference to the illustrated embodiments. However, the present invention is not limited to these embodiments. That is, the configuration of each section may be replaced by an arbitrary configuration having a similar function.

For example, in the embodiments described above, a difference voltage $\Delta V$ has been calculated for mutually adjacent two voltage measuring ICs. However, the present invention is not limited to this configuration. That is, a difference voltage $\Delta V$ may be calculated from the reference voltages Vref measured by arbitrary two voltage measuring ICs. For example, when k blocks are provided (k=5 in the embodiments described above), the main microcomputer 33 may calculate a difference voltage between the reference voltage Vref measured by the voltage measuring IC of the n-th block ($1 \leq n < k$) among the k blocks and the reference voltage Vref measured by the voltage measuring IC of the (n+1)-th block, and then may perform abnormality determination on the basis of this difference voltage.

Further, the embodiments given above have been described for an exemplary case that the voltage of each of the unit cells BT1 to BT55 is measured and then transmitted to the main microcomputer 33. Instead, each of the voltage measuring ICs (21-1 to 21-5) may measure the total voltage in each of the blocks 61-1 to 61-5 (i.e., the total of the voltages of the 11 unit cells), and then transmit the result to the main microcomputer 33.

Further, the embodiments given above have been described for an exemplary case of a secondary battery mounted on a vehicle. However, the present invention is not limited to this case, and may be applied to a secondary battery used for other purposes.

The present invention is remarkably useful in recognizing abnormality in voltage measuring ICs that measure the output voltages of a plurality of unit cells constituting a high voltage battery.

What is claimed is:

1. A voltage measuring apparatus for measuring an output voltage of an assembled battery in which a plurality of unit cells are connected in series, the voltage measuring apparatus comprising:
    block voltage detection sections, each section measuring a voltage of each block of a plurality of blocks into which the plurality of unit cells are divided;
    a reference voltage output section provided in each of the voltage detection sections to output a reference voltage;
    a difference voltage calculating section which is adapted to calculate a difference voltage between a measured value of the reference voltage measured by one of the block voltage detection sections and a measured value of the reference voltage measured by another of the block voltage detection sections;
    a difference voltage determination section which is adapted to determine whether each of the difference voltages exceeds a given threshold voltage or not; and
    an abnormality determination section which is adapted to determine that abnormality occurs in the voltage measuring apparatus when at least one of the difference voltages is determined as greater than the threshold voltage.

2. The voltage measuring apparatus according to claim 1, wherein the block voltage detection section includes an A/D converter that digitizes a voltage of each of the unit cells and the reference voltages, and
    the difference voltage calculating section calculates the difference voltage between measured values of the two digitized reference voltages.

3. The voltage measuring apparatus according to claim 1, wherein the plurality of unit cells are divided into k blocks, and
    the difference voltage calculating section calculates the difference voltage between the reference voltage measured by the block voltage detection section corresponding to the n-th block ($1 \leq n < k$) among the k blocks and the reference voltage measured by the block voltage detection section corresponding to the (n+1)-th block.

4. The voltage measuring apparatus according to claim 3, wherein the difference voltage calculating section calculates the difference voltage between the reference voltage measured by the block voltage detection section corresponding to the k-th block and the reference voltage measured by the block voltage detection section corresponding to the 1st block.

5. The voltage measuring apparatus according to claim 1, wherein the difference voltage calculating section calculates the difference voltage between the reference voltages measured by the mutually-adjacent block voltage detection sections.

6. A voltage measuring apparatus for measuring an output voltage of an assembled battery in which a plurality of unit cells are connected in series, the voltage measuring apparatus comprising:
    block voltage detection sections, each section measuring a voltage of each block of a plurality of blocks into which the plurality of unit cells are divided;
    a reference voltage output section provided in each of the voltage detection sections to output a reference voltage;
    a difference voltage calculating section which is adapted to calculate a difference voltage between a measured value of the reference voltage measured by one of the block voltage detection sections and a measured value of the reference voltage measured by another of the block voltage detection sections;
    a standard difference voltage storing section for storing therein a standard difference voltage as a standard of the difference voltage between a measured value of the reference voltage measured by said one of the block voltage detection sections and a measured value of the reference voltage measured by said another of the block voltage detection sections;
    a difference voltage determination section which is adapted to determine whether a difference between the difference voltage calculated by the difference voltage calculating section and the standard difference voltage stored in the standard difference voltage storing section exceeds a given threshold voltage or not; and
    an abnormality determination section which is adapted to determine that abnormality occurs in the voltage measuring apparatus when the difference is determined as greater than the threshold voltage.

7. The voltage measuring apparatus according to claim 6, wherein the block voltage detection section includes an A/D converter that digitizes a voltage of each of the unit cells and the reference voltages, and
    the difference voltage calculating section calculates the difference voltage between measured values of the two digitized reference voltages.

8. The voltage measuring apparatus according to claim 6, wherein the plurality of unit cells are divided into k blocks, and
    the difference voltage calculating section calculates the difference voltage between the reference voltage measured by the block voltage detection section corresponding to the n-th block ($1 \leq n < k$) among the k blocks and the reference voltage measured by the block voltage detection section corresponding to the (n+1)-th block.

9. The voltage measuring apparatus according to claim 8, wherein the difference voltage calculating section calculates the difference voltage between the reference voltage measured by the block voltage detection section corresponding to the k-th block and the reference voltage measured by the block voltage detection section corresponding to the 1st block.

10. The voltage measuring apparatus according to claim 6, wherein the difference voltage calculating section calculates the difference voltage between the reference voltages measured by the mutually-adjacent block voltage detection sections.

* * * * *